United States Patent
Lin

(10) Patent No.: US 9,801,292 B1
(45) Date of Patent: Oct. 24, 2017

(54) COUPLING AND FIXING STRUCTURE OF POWER MODULE AND CASING OF POWER SUPPLY

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW), `

( * ) Notice: Subject to any disclaimer, the term of this patent is extended or adjusted under 35 U.S.C. 154(b) by 0 days.

(21) Appl. No.: 15/148,662

(22) Filed: May 6, 2016

(51) Int. Cl.
  *H05K 7/00* (2006.01)
  *H05K 5/00* (2006.01)
  *H05K 5/02* (2006.01)

(52) U.S. Cl.
  CPC ......... *H05K 5/0021* (2013.01); *H05K 5/0008* (2013.01); *H05K 5/0221* (2013.01)

(58) Field of Classification Search
  CPC ........................... H05K 5/0021; H05K 5/0008
  USPC ................. 361/747, 807, 809, 810
  See application file for complete search history.

(56) References Cited

U.S. PATENT DOCUMENTS

| | | | | |
|---|---|---|---|---|
| 6,354,861 B2 * | 3/2002 | Schmitt | ................. | H01R 13/64 361/679.37 |
| 7,364,442 B2 * | 4/2008 | Bang | ................... | H05K 1/0215 411/522 |
| 7,477,528 B2 * | 1/2009 | Kim | ........................ | H05K 5/02 361/752 |
| 7,639,506 B2 * | 12/2009 | Chen | ...................... | G06F 1/184 312/223.2 |
| 9,632,546 B2 * | 4/2017 | Peng | ...................... | G06F 1/187 |
| 2008/0151523 A1 * | 6/2008 | Chen | .................... | G11B 33/124 361/807 |
| 2009/0073651 A1 * | 3/2009 | Hu | ........................ | G06F 1/184 361/679.58 |
| 2013/0037673 A1 * | 2/2013 | Li | .......................... | G06F 1/187 248/309.1 |

* cited by examiner

*Primary Examiner* — Hung S Bui
(74) *Attorney, Agent, or Firm* — Ming Chow; Sinorica, LLC

(57) ABSTRACT

A coupling and fixing structure of a power module and a casing of a power supply includes a casing and three power modules. The casing is provided with three first raised studs and three second raised studs corresponding to the power modules respectively. Each power module has a positioning recess and a positioning hole corresponding to the respective first raised stud and the respective second stud. The positioning recess and the positioning hole of the power module are aligned with the first raised stud and the second raised stud of the casing respectively, and then the power module is slightly moved toward the first side to be positioned and locked. The present invention can enhance the operational efficiency of coupling and fixing effectively.

1 Claim, 7 Drawing Sheets

COUPLING AND FIXING STRUCTURE OF POWER MODULE AND CASING OF POWER SUPPLY

BACKGROUND OF THE INVENTION

1. Field of the Invention

The present invention relates to a coupling and fixing structure, and more particularly to a coupling and fixing structure of a power module and a casing of a power supply.

2. Description of the Prior Art

Under the rapid development of the electronic information industry, people need to use complicated computer and information equipment for data processing. For example, there are a considerable number of computer hosts, hubs and power supplies in the IT room of an Internet company or an enterprise. Therefore, the electronic components of the complete equipment are also more complex compared to the conventional equipment, and their coupling and fixing structures are relatively complex.

In a coupling and fixing structure of a power module and a casing of a conventional power supply, the casing includes a bottom board. The bottom board is formed with a plurality of threaded holes for engagement of screws. The power module includes a board corresponding to the bottom board. The board is formed with a plurality of through holes corresponding to the threaded holes of the bottom board. When the power module and the casing are assembled, the through holes of the board are first aligned with the threaded holes of the bottom board and then locked by the screws to complete the assembly of the power module and the casing. Good light is required for the operator to aim at the holes. Thus, the operation is inconvenient.

An improved coupling and fixing structure is developed accordingly. Two sides of a first board and a second board are longitudinally provided with a side board, respectively. The side boards are formed with corresponding threaded holes. When the first board and the second board are coupled to the working surface of a desk, the light can be improved to enhance the operational efficiency of coupling and fixing.

However, this improved coupling and fixing structure still has some shortcomings. Accordingly, the inventor of the present invention has devoted himself based on his many years of practical experiences to solve these problems.

SUMMARY OF THE INVENTION

The primary object of the present invention is to provide a coupling and fixing structure of a power module and a casing of a power supply. It is easier and more convenient for the operator to aim at holes. The present invention can enhance the operational efficiency of coupling and fixing effectively.

In order to achieve the aforesaid object, a coupling and fixing structure of a power module and a casing of a power supply of the present invention comprises a casing and at least one power module. The casing includes a first bottom board. A top surface of the first bottom board is provided with at least one first raised stud and at least one second raised stud. Each of the first raised stud and the second raised stud is adapted for a locking member to be locked thereon. The power module includes a second bottom board. One side of the second bottom board is defined as a first side. The second bottom board has a positioning recess disposed close to the first side and corresponding to the first raised stud. The positioning recess extends outward toward the first side and is gradually enlarged to form an opening. The second bottom board is formed with a positioning hole corresponding to the second raised stud. The positioning hole is an elongated hole. The positioning hole has a positioning portion opposite to the positioning recess and extending toward the first side.

When the user wants to assemble the power module and the casing, the positioning recess and the positioning hole of the second bottom board are aligned with the first raised stud and the second raised stud of the first bottom board respectively, and then the power module is slightly moved toward the first side to be positioned through guidance of the positioning recess and locked by the locking member. In this way, the power module is coupled and fixed to the casing easily. The present invention can simplify the alignment of holes and enhance the operational efficiency of coupling and fixing effectively.

DETAILED DESCRIPTION OF THE PREFERRED EMBODIMENTS

Embodiments of the present invention will now be described, by way of example only, with reference to the accompanying drawings.

Figure 1:
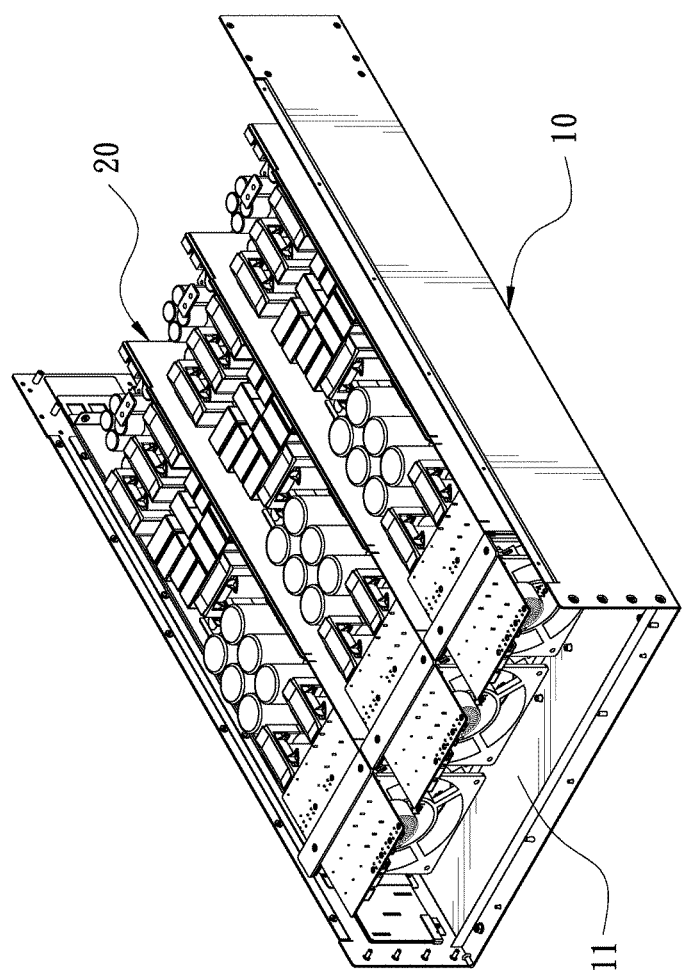
FIG. 1 is a perspective view in accordance with a preferred embodiment of the present invention.
Figure 2:
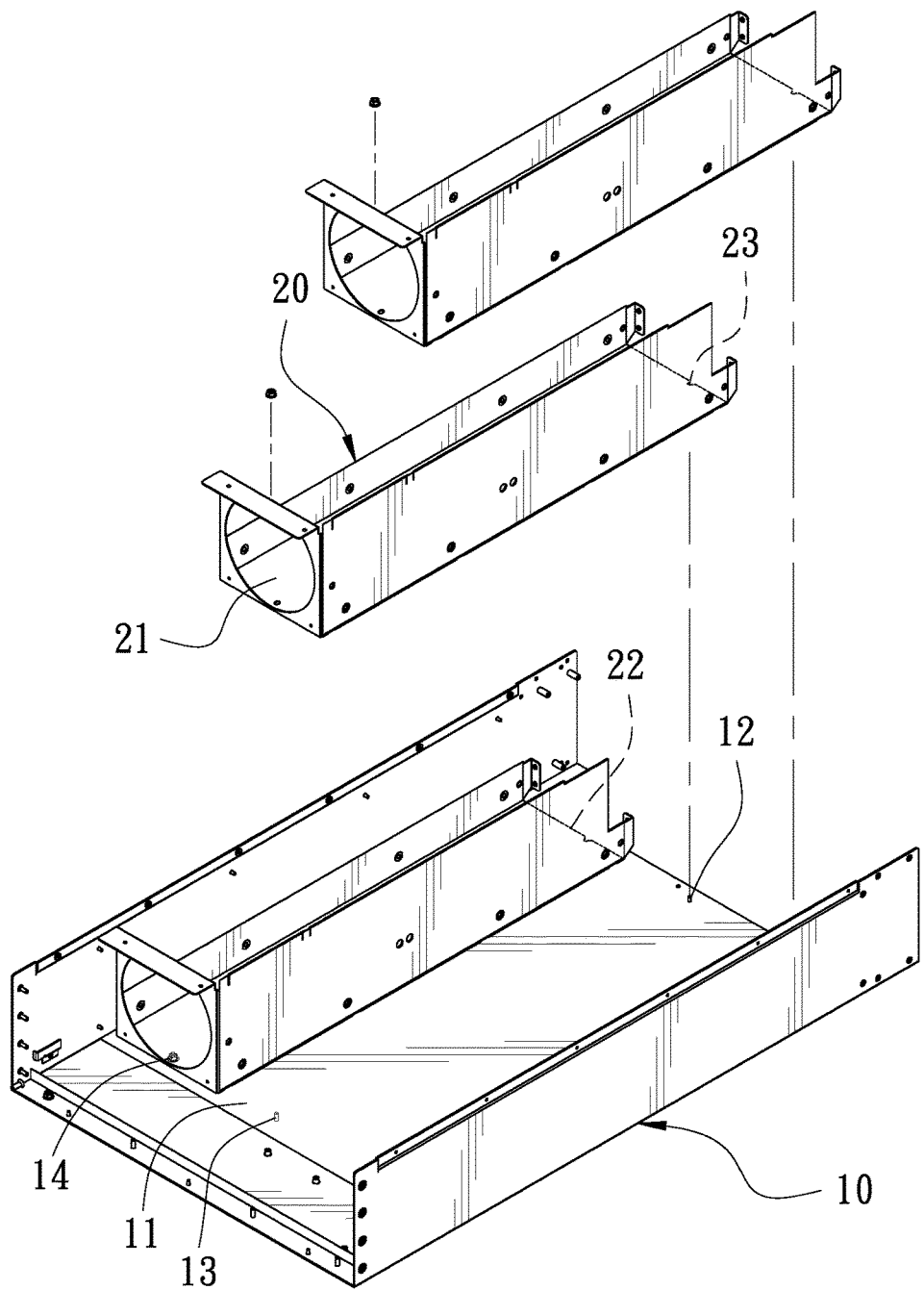
FIG. 2 is an exploded view in accordance with the preferred embodiment of the present invention.
Figure 3:
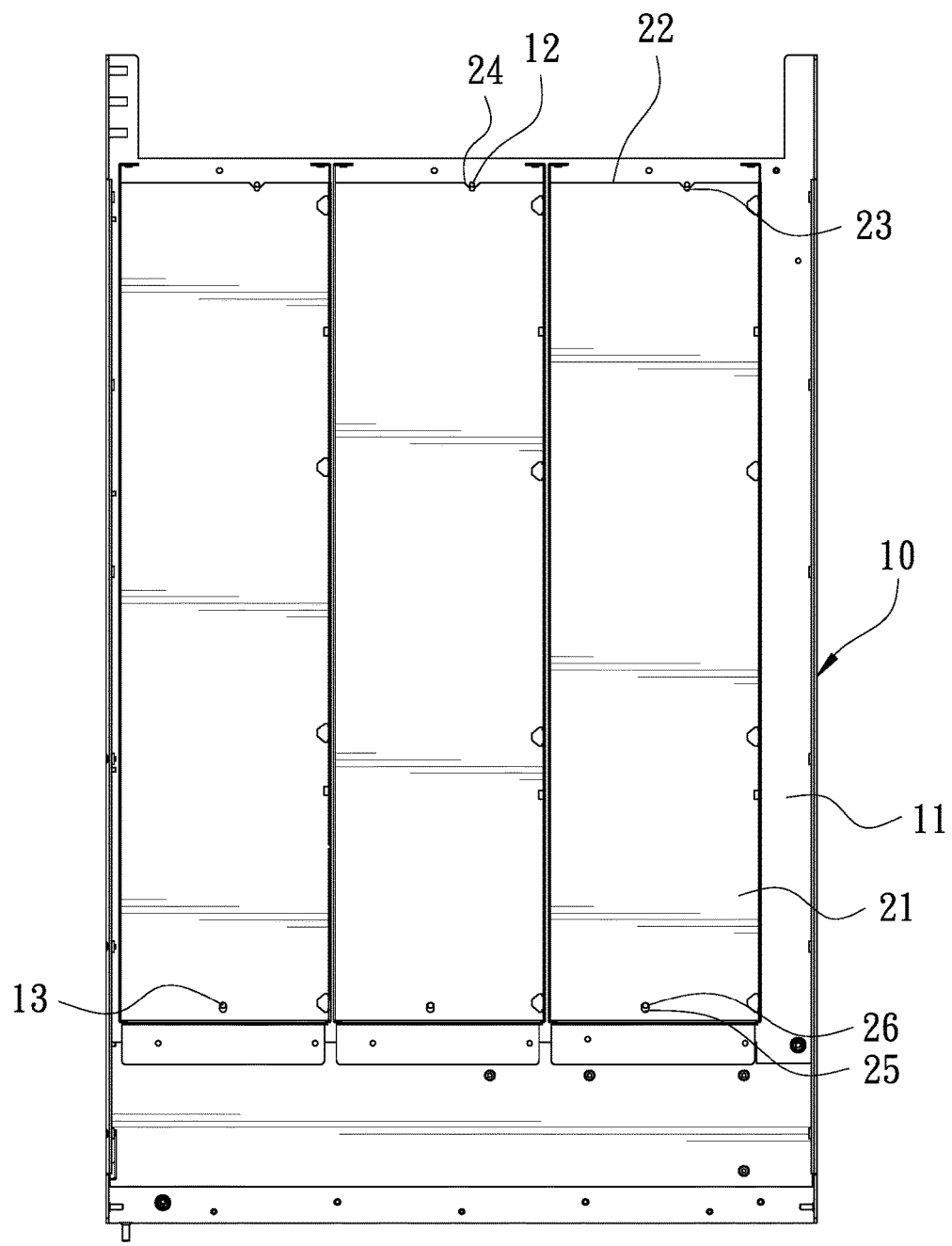
FIG. 3 is a top view in accordance with the preferred embodiment of the present invention, showing the power module and the casing before coupling.

FIG. 1 is a perspective view in accordance with a preferred embodiment of the present invention. FIG. 2 is an exploded view in accordance with the preferred embodiment of the present invention. FIG. 3 is a top view in accordance with the preferred embodiment of the present invention. The present invention discloses a coupling and fixing structure of a power module and a casing of a power supply. In the preferred embodiment, the present invention comprises a casing 10 and three power modules 20.

The casing 10 includes a first bottom board 11. A top surface of the first bottom board 11 is provided with three first raised studs 12 and three second raised studs 13. The first raised studs 12 and the second raised studs 13 correspond in position to each other and are disposed at front and rear sides of the first bottom board 11, respectively. Each of the first raised studs 12 and the second raised studs 13 is adapted for a locking member 14 to be locked thereon. Each of the first raised studs 12 and the second raised studs 13 is a screw stud, and the locking member 14 is a nut.

Each power module 20 includes a second bottom board 21. One side of the second bottom board 21 is defined as a first side 22. The second bottom board 21 has a positioning recess 23 which is disposed close to the first side 22 and corresponds to the first raised stud 12. The positioning recess 23 extends outward toward the first side 22 and is gradually enlarged to form an opening 24. The second bottom board 21 is formed with a positioning hole 25 corresponding to the second raised stud 13. The positioning hole 25 is an elongated hole. The positioning hole 25 has a positioning portion 26 opposite to the positioning recess 23 and extending toward the first side 22. Wherein, the positioning recess 23 and the positioning hole 25 are disposed at two sides of the second bottom board 21, respectively.

Figure 6:
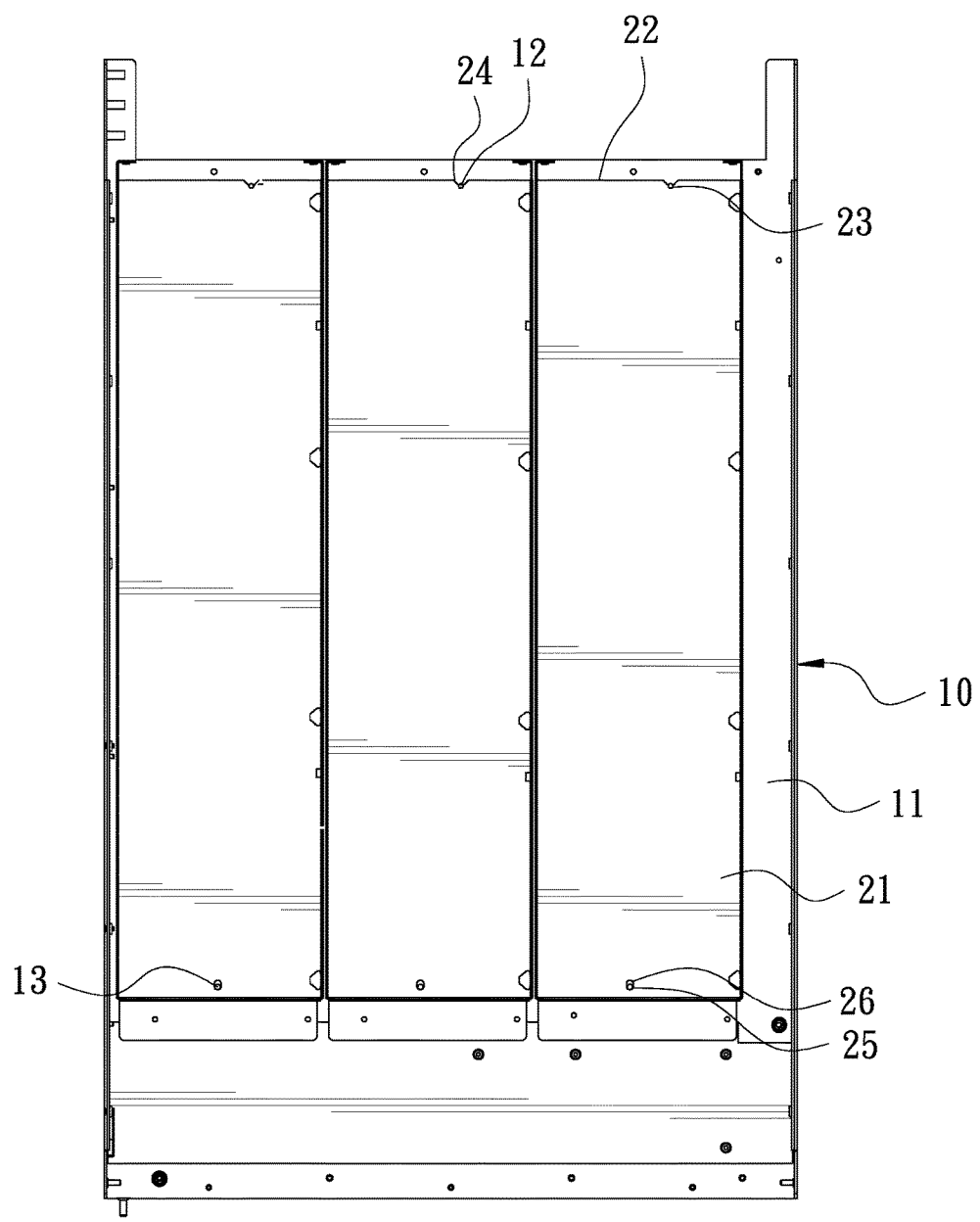
FIG. 6 is a top view in accordance with the preferred embodiment of the present invention, showing the power module and the casing after coupling.

FIG. 3 is a top view in accordance with the preferred embodiment of the present invention, showing the power module and the casing before coupling. FIG. 6 is a top view in accordance with the preferred embodiment of the present invention, showing the power module and the casing after coupling. To assemble the power modules 20 and the casing 1, the second bottom 21 of each power module 20 is first aligned with the first bottom board 11 of the casing 10, with the opening 24 of the positioning recess 23 and the positioning portion 26 of the second bottom board 21 to align with the first raised stud 12 and the second raised stud 13 of the first bottom board 11 respectively. The second bottom 21 of each power module 20 is put down accordingly to complete the procedure of alignment and placement. The bottom board 21 of each power module 20 is slightly moved for the first raised stud 12 and the second raised stud 13 of the first bottom board 11 to be engaged in the positioning recess 23 and the positioning hole 25 of the second bottom board 21 respectively. Through the guidance of the positioning recess, the power module can be automatically positioned to complete the procedure of engagement. The locking members 14 are locked to the first raised stud 12 and the second raised stud 13 respectively, such that the power modules 20 are coupled to the casing 10.

Figure 4:
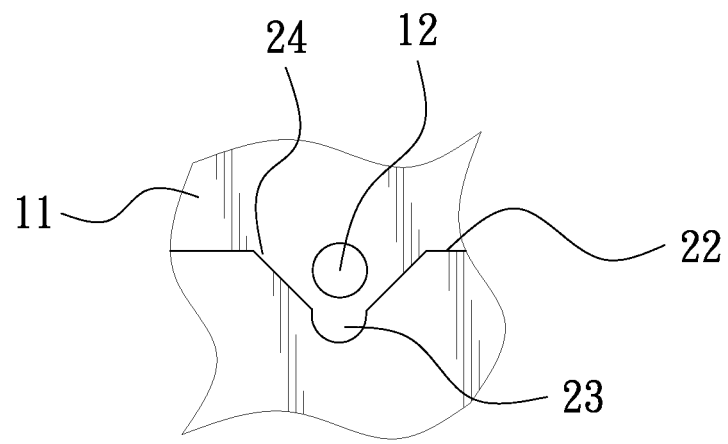
FIG. 4 is a partial enlarged view in accordance with the preferred embodiment of the present invention, showing the first raised stud and the positioning recess before the power module is coupled to the casing.
Figure 5:
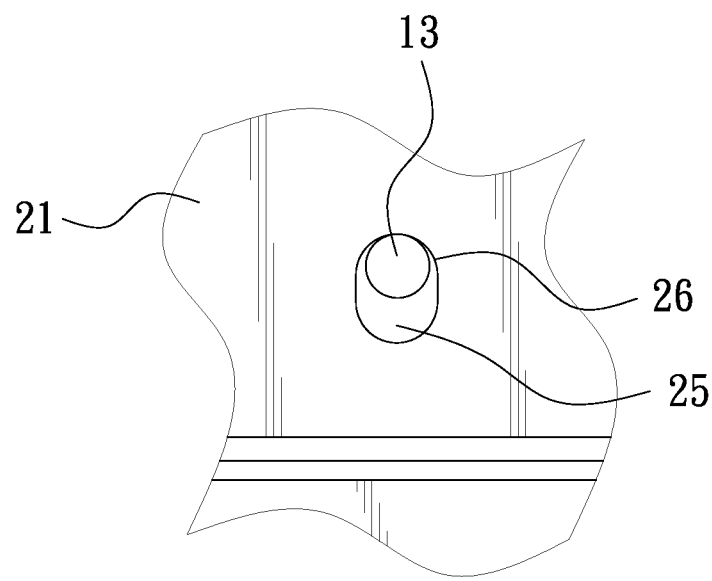
FIG. 5 is a partial enlarged view in accordance with the preferred embodiment of the present invention, showing the second raised stud and the positioning hole before the power module is coupled to the casing.

FIG. 4 is a partial enlarged view in accordance with the preferred embodiment of the present invention, showing the first raised stud and the positioning recess before the power module is coupled to the casing. FIG. 5 is a partial enlarged view in accordance with the preferred embodiment of the present invention, showing the second raised stud and the positioning hole before the power module is coupled to the casing. In general, the coupling and fixing way is user-friendly and in a top-down manner. In the preferred embodiment of the present invention, the positioning recess 23 is close to the first side 22 of the second bottom board 21 and the positioning recess 23 extends outward toward the first side 22 and is gradually enlarged to form the opening 24, enabling the operator to align the opening 24 of the second bottom board 21 with the first raised stud 12 of the first bottom board 11 easily. As shown in FIG. 4, the positioning hole 25 and the positioning portion 26 jointly form an elongated hole, enabling the operator to align the positioning portion 26 of the second bottom board 21 with the second raised stud 13 of the first bottom board 11 easily so as to simplify the procedure of alignment.

Figure 7:
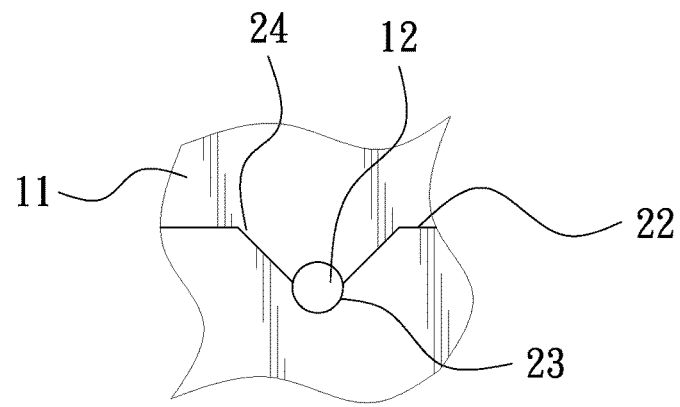
FIG. 7 is a partial enlarged view in accordance with the preferred embodiment of the present invention, showing the first raised stud and the positioning recess after the power module is coupled to the casing.
Figure 8:
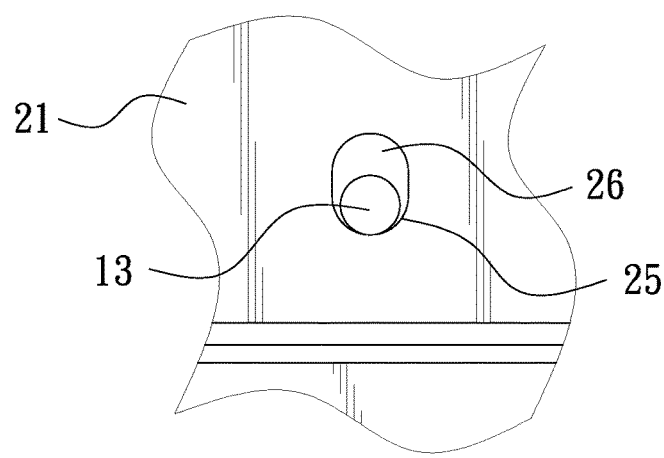
FIG. 8 is a partial enlarged view in accordance with the preferred embodiment of the present invention, showing the second raised stud and the positioning hole after the power module is coupled to the casing.
Figure 9:
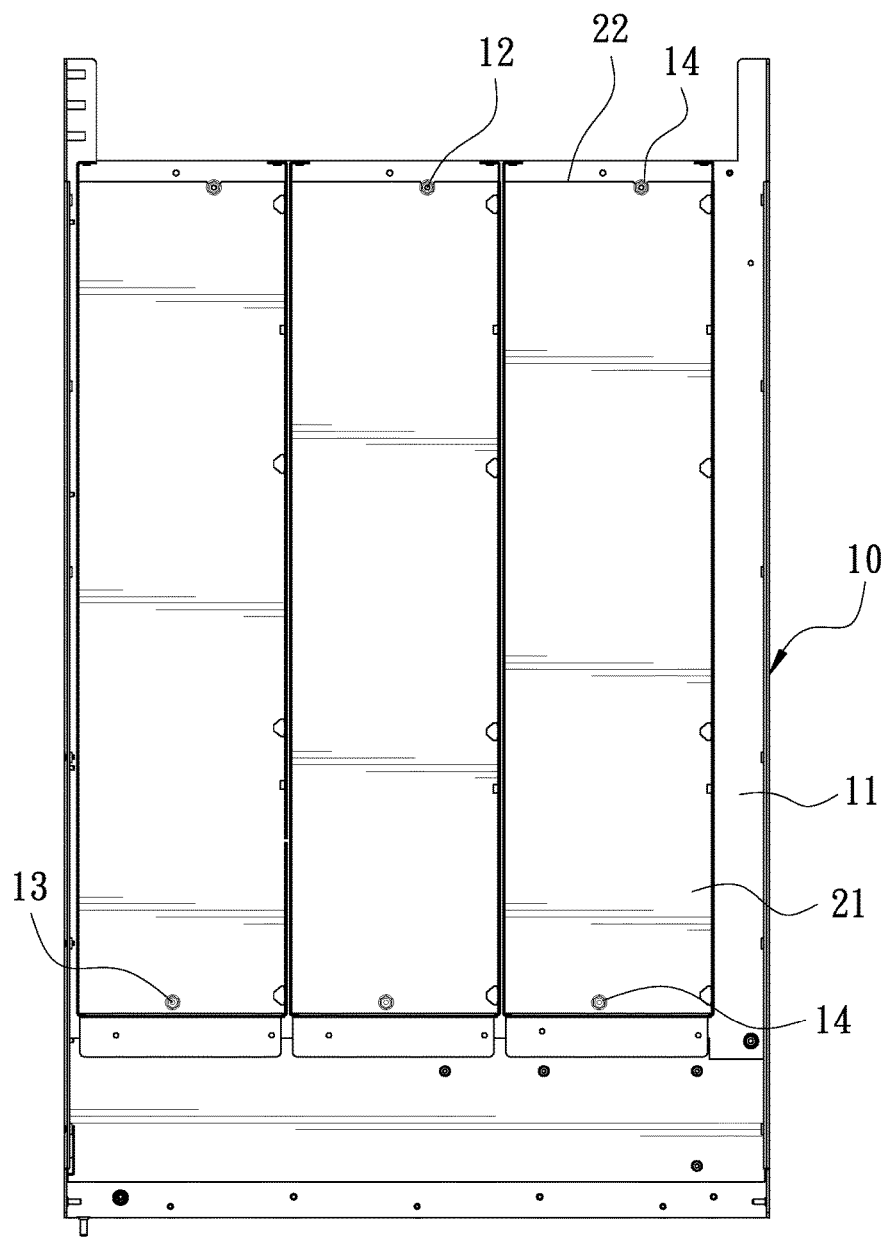
FIG. 9 is a schematic view in accordance with the preferred embodiment of the present invention when in use, showing the power module and the casing after coupling.

FIG. 6 is a top view in accordance with the preferred embodiment of the present invention, showing the power module and the casing after coupling. FIG. 7 is a partial enlarged view in accordance with the preferred embodiment of the present invention, showing the first raised stud and the positioning recess after the power module is coupled to the casing. FIG. 8 is a partial enlarged view in accordance with the preferred embodiment of the present invention, showing the second raised stud and the positioning hole after the power module is coupled to the casing. FIG. 9 is a schematic view in accordance with the preferred embodiment of the present invention when in use, showing the power module and the casing after coupling. After alignment, the second bottom board 21 of each power module 20 is slightly moved in the direction away from the first side 22 for the first raised stud 12 and the second raised stud 13 of the first bottom board 11 to be engaged in the positioning recess 23 and the positioning hole 25 of the second bottom board 21 respectively to complete the procedure of engagement. As shown in FIG. 6, FIG. 7, FIG. 8, the positioning recess 23 and the positioning hole 25 correspond to the first raised stud 12 and the second raised stud 13 respectively, so that the engagement effect is better. Finally, the locking members 14 are locked to the first raised stud 12 and the second raised stud 13 respectively. As shown in FIG. 9, the power modules 20 are coupled to the casing 10. The present invention can enhance the operational efficiency of coupling and fixing effectively.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A coupling and fixing structure of a power supply comprising:
   a casing;
   a power module;
   the casing comprising a first bottom board, a first raised stud, a second raised stud, a first locking member and a second locking member;
   the first bottom board comprising a top surface, a front side and a rear side;
   the top surface being formed in between the front side and the rear side;
   the first raised stud being disposed on the top surface and located adjacent to the front side;
   the second raised stud being disposed on the top surface and located adjacent to the rear side;
   the first raised stud being interlocked with the first locking member;
   the second raised stud being interlocked with the second locking member;
   the power module comprising a second bottom board, a positioning recess and a positioning hole;
   the second bottom board comprising an upper surface, a lower surface, a first side and a second side;
   the upper surface and the lower surface being formed opposite to each other;
   the upper surface and the lower surface being formed in between the first side and the second side;
   the first side corresponding to the front side;
   the second side corresponding to the rear side;
   the positioning recess penetrating through the upper surface and the lower surface and being located adjacent to the first side;

the positioning hole penetrating through the upper surface and the lower surface and being located adjacent to the second side;

the positioning recess corresponding to the first raised stud;

the positioning recess extending outward toward the first side and being gradually enlarged to form an enlarged opening;

the positioning hole corresponding to the second raised stud;

the positioning hole being an elongated hole;

the positioning hole comprising a positioning portion;

the positioning portion being located opposite to the positioning recess and extending toward the first side;

the first raised stud being accommodated within the enlarged opening and the second raised stud being inserted into the positioning hole in response to the power module being assembled to the casing;

the power module being slightly moved toward the front side through guidance of the positioning portion so as to insert the first raised stud into the positioning recess in response to the first raised stud being accommodated within the enlarged opening and the second raised stud being inserted into the positioning hole;

the first raised stud and the second raised stud being respectively locked by the first locking member and the second locking member in response to the power module being slightly moved toward the front side through guidance of the positioning portion so as to insert the first raised stud into the positioning recess;

the first raised stud and the second raised stud each being a screw; and the first locking member and the second locking member each being a nut.

* * * * *